(12) United States Patent
Waslo et al.

(10) Patent No.: US 7,816,914 B1
(45) Date of Patent: Oct. 19, 2010

(54) BUILT-IN TESTING AND TRANSIENT AVOIDANCE FOR MAGNETIC SENSORS

(75) Inventors: George W. Waslo, Liberty Township, OH (US); Roger W. Dickerson, Loveland, OH (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/709,478

(22) Filed: Feb. 20, 2010

Related U.S. Application Data

(62) Division of application No. 11/627,662, filed on Jan. 26, 2007.

(51) Int. Cl.
*G01R 33/02* (2006.01)
(52) U.S. Cl. .................... 324/244; 324/261
(58) Field of Classification Search .......... 324/244, 324/260–261
See application file for complete search history.

(56) References Cited

U.S. PATENT DOCUMENTS

| | | | |
|---|---|---|---|
| 4,837,519 A | 6/1989 | Lopetrone et al. | |
| 5,837,519 A | 11/1998 | Savage et al. | |
| 7,026,812 B2 | 4/2006 | Honkura et al. | |
| 2004/0108854 A1 | 6/2004 | Nichols | |
| 2005/0140355 A1* | 6/2005 | Yamada et al. | 324/137 |
| 2006/0248964 A1* | 11/2006 | McCoy | 73/862 |
| 2007/0000622 A1* | 1/2007 | Reed et al. | 160/188 |
| 2007/0000684 A1* | 1/2007 | Harada et al. | 174/250 |

* cited by examiner

*Primary Examiner*—Bot L LeDynh
(74) *Attorney, Agent, or Firm*—Marsteller & Associates, P.C.

(57) ABSTRACT

A magnetic sensor assembly (100) uses printed circuit boards (PCB) (102) having a first surface (130) and an opposite, complementary second surface (132) to fabricate the sensor devices (104) and their associated processing circuitry. A trace or conductive element (106), or pair (108a, 108b) of complementary printed traces or conductor elements, on or within the board (102) are run beneath the magnetic sensor element (104), with the return trace or traces routed more remotely from the sensor (104).

11 Claims, 5 Drawing Sheets

BUILT-IN TESTING AND TRANSIENT AVOIDANCE FOR MAGNETIC SENSORS

CROSS REFERENCE TO RELATED APPLICATIONS

This application is a Divisional of U.S. application Ser. No. 11/627,662, filed on Jan. 26, 2007

BACKGROUND OF THE INVENTION

1. Technical Field

The invention relates to the field of magnetic sensors, and more particularly to a system and method for magnetic sensor transient interference avoidance and built in testing schemes.

2. Background Art

A magnetic activity sensor (such as a fluxgate) must be extremely sensitive to very low frequency magnetic fields in order to detect vehicles or armed personnel at appreciable distances. The circuitry associated with such sensors typically involves very high analog signal gains and very long time constants. This level of magnetic field is lower than is normally experienced near circuitry that includes supply current transients.

To simplify placement of a sensor, it is desirable to house it in the same enclosure with processing and communication circuitry, such as RF transmitters or serial interfaces. Unfortunately transients in such circuitry, when currents increase or decrease, can cause interference to the detectors and cause false alarms or degrade operation of background noise adaption algorithms. Long time constants (in the order of tens of seconds) which the circuit must incorporate can result in the sensor being unusable for appreciable times after such transients, limiting its usability.

Additionally, magnetic activity sensors, such as fluxgates and magneto-inductive devices are sensitive to small low-frequency magnetic fields. Testing of such devices requires generation of repeatable low-level fields relative to the position of the sensor.

One way to produce such a field is to use a pair of Helmholz coils to create a uniform field, in which the magnetic sensor device can be placed. Because the field is uniform, placement of the sensor within the coils is not critical, though orientation in the field must be controlled. Also, the coils must be large relative to the size of the device being measured and such testing requires the additional steps of placing the device in such a fixture to measure performance.

While the above cited references introduce and disclose a number of noteworthy advances and technological improvements within the art, none completely fulfills the specific objectives achieved by this invention.

DISCLOSURE OF INVENTION

In accordance with the present invention, in a first embodiment a magnetic sensor assembly of the type having at least one capacitor electrically connecting an output signal from a magnetic sensor unit to an output signal source of the magnetic sensor assembly includes at least one switch for controllably electrically disconnecting the capacitor from the output signal from the magnetic sensor unit and alternatively connecting the capacitor to the output signal from the magnetic sensor unit. The capacitor is disconnected from the magnetic sensor unit by operation of the switch during times that transient signals may be generated by the magnetic sensor unit thereby preventing changes to the charge on the capacitor due to expected transients.

Preferably, the switch is an analog switch activated by a signal from a processor unit. Generally, at least one electronic module is co-located in proximity to the magnetic sensor unit and causes the transient output signals from the magnetic sensor unit. When the electronic module electrically communicates with the processor unit, the processor unit is "aware" when the transient signals may be promoted within the magnetic sensor unit and uses this information to determine when to open the switch.

In a second embodiment a magnetic sensor assembly having a built-in testing capability includes at least one magnetic sensor module for detecting changes in a magnetic field. The magnetic sensor module is preferably mounted on or essentially external to a first surface of a printed circuit board (PCB) member with the first surface of the PCB being positioned between the magnetic sensor module(s) and a second surface of the PCB that is opposite to the first surface of the PCB. At least one conductive path or trace is formed between the magnetic sensor module and the second surface of the PCB for conveying an electrical or other electro-magnetic signal beneath the magnetic sensor module to permit operational testing of the magnetic sensor module as desired. Generally, the conductive path or trace is formed within the PCB between the first and second surfaces.

The present invention comprises a magnetic sensor transient interference avoidance method that uses analog switches to disconnect capacitors associated with the large time constants from being charged during the brief periods in which the transients occur, and also comprises circuitry, logic, and features to provide magnetic test fields for the sensor using conductive paths near the sensor.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

Figure 1:
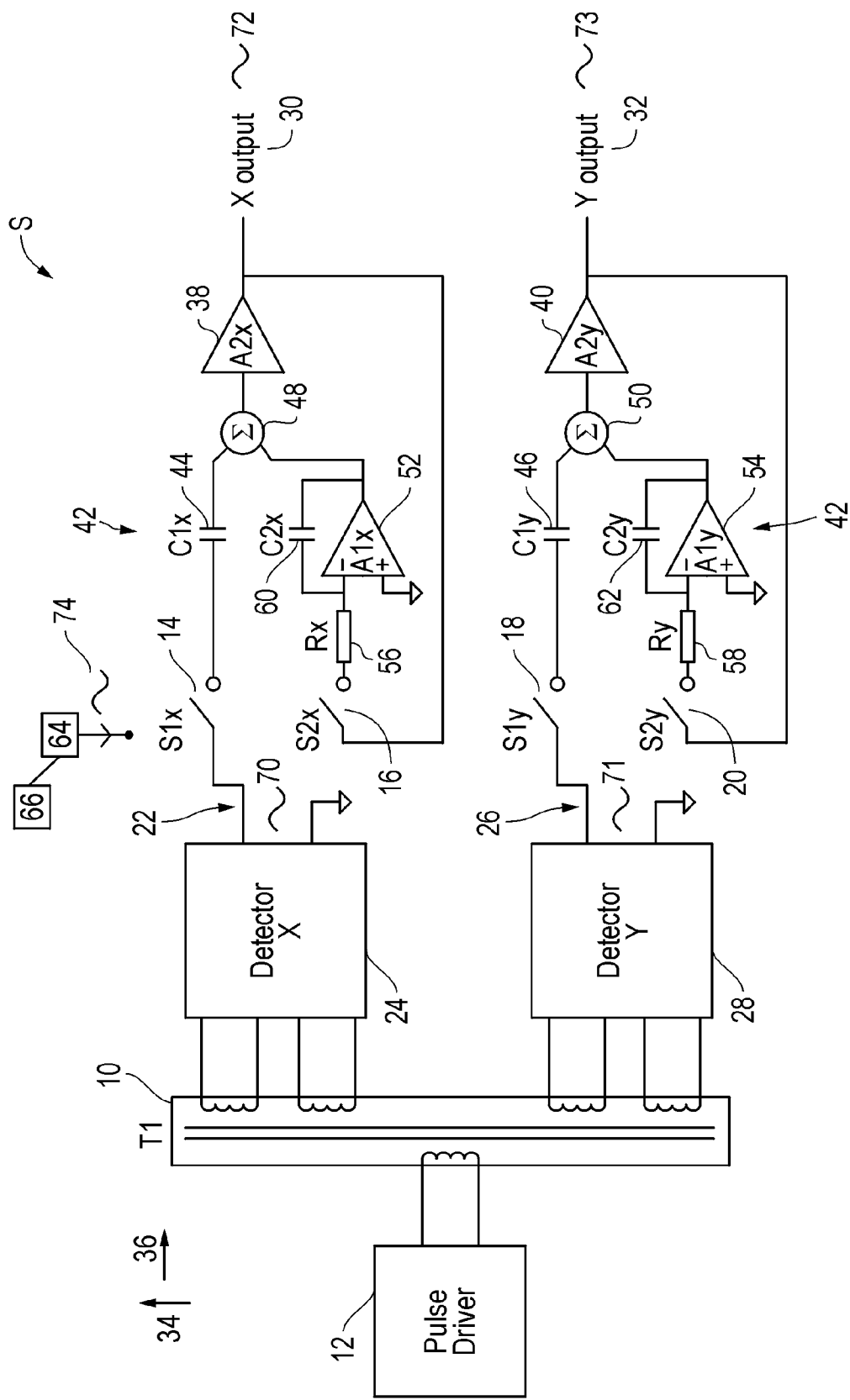
FIG. 1 is a diagram of a first embodiment of the present invention.

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

In a first embodiment of the present invention, a magnetic sensor assembly S of the type having at least one capacitor 44 electrically connecting an output signal 70 from a magnetic sensor unit 24 to an output signal source 30 of the magnetic sensor assembly S includes at least one switch 14 for controllably electrically disconnecting the capacitor 44 from the output signal 70 from the magnetic sensor unit 24 and alternatively connecting the capacitor 44 to the output signal 70 from the magnetic sensor unit 24. The capacitor 44 is disconnected from the magnetic sensor unit 24 by operation of the switch 14 during times that transient signals may be generated by the magnetic sensor unit 24 thereby preventing a charge on capacitor 44 from being altered.

Preferably, the switch 14 is an analog switch activated by a signal 74 from a processor unit 64. Generally, at least one electronic module 66 is co-located in proximity to the magnetic sensor unit 24 and causes the transient output signals from the magnetic sensor unit 24. When the electronic module 66 electrically communicates with the processor unit 64, the processor unit 64 is "aware" when the transient signals may be promoted within the magnetic sensor unit 24 and uses this information to open the corresponding switch 14 as appropriate.

In the first embodiment of the present invention of a magnetic sensor circuit S uses analog switches to disconnect one or more capacitors 14, 18 associated with the large time constants from being charged during the brief periods in which transient signals occur that are greater in amplitude or duration than normally operating output signals 70, 71 produced by a magnetic sensor unit 24, 28 during normal operation. This prevents capacitors 14, 18 from being charged by the transient and allows the circuit S to resume detection immediately after the transient has passed.

The overall sensor amplifier circuit S is DC coupled, with the highpass function implemented by only a large input coupling capacitor (to reject large DC level associated with static magnetic fields) and another in an integrator in a servo-feedback loop. Analog switches prevent an electric charge from entering the capacitors 14, 18 during the occurrence of the transient signal. A system processor 64 that may be housed in the unit within the same enclosure or in proximity to the magnetic sensor modules 24, 28 knows when a RF transmission and other high current events will likely occur and opens switches 14-20 during those times when the transient signals may be produced.

Referring particularly to FIG. 1, a fluxgate magnetometer coil and core 10 in the circuit S is driven into saturation by pulses from a Pulse Driver 12. In normal operation, switches 14-20 are closed.

Magnetic flux levels generate voltage signals 70, 71 at the output 22 of Detector_x 24 and at the output 26 Detector_y 28 using known diode networks. The voltage signal 30 from Detector_x 24 corresponds to near-instantaneous flux levels in an x or first direction 34 and the voltage signal 32 from Detector_y 28 corresponds to flux levels in a y or second direction 36.

The voltage signals 70, 71 normally contain relatively large steady state DC levels on which very small variations are superimposed. The small variations, which are caused by nearby magnetic activity, are of interest and the DC must be rejected to avoid overdriving the amplifiers 38, 40. This may be done by a simple DC block, for example, a first order highpass filter 42 formed by capacitors 44, 46 and the input resistance of the summing nodes 48, 50. The time constant of the highpass filter 42 for normal use is very long, such as on the order of tens of seconds.

Amplifiers 38, 40 preferably have very large voltage gains to bring the small voltage variations to usable levels. Because of the large gain, small voltage offsets from the amplifiers 38, 40 can result in output errors and dynamic range limitations. The integrators formed by operational amplifier 52, with resistor 56, and capacitor 60, and similarly by operational amplifier 54, with resistor 58, and capacitor 62, are used in feedback loops around amplifiers 38, 40 to coordinate or shift their outputs toward a selected center reference or ground voltage. This results in another highpass response pole with a very long time constant for the resulting amplifier circuit.

When a large magnetic disturbance occurs, such as results from current surges in nearby circuitry housed in the same enclosure with the magnetometer circuitry S, the amplifiers 38, 40 could be driven into saturation and because of the large time constants could take a considerable time to recover from the transient. During this recovery time, the sensor 10 could not be used to sense the low level magnetic activity it is intended to monitor.

In the present invention, because the processor unit 64 for the overall system knows when these disturbances will occur, it opens the switches 14, 16 just before and for the duration of the disturbance. This disconnects the amplifier 38, for example, from the detectors 24, 28 to prevent the disturbance from changing the charges stored on the capacitors 44, 46. The disconnection of these capacitors, however, was found in practice to result in anomalies at the input of amplifiers 38, 40, due to the imperfections in the switches 14-20. The anomalies, amplified to significant levels by amplifiers 38, 40, could alter the charges in the integrator capacitors 60, 62. When the switches are again closed after the disturbance has passed, the circuit S could then still require a significant recovery time for the integrators to again settle. To avoid this problematic condition, switches 16, 20 are also opened to avoid the anticipated disturbance. This isolates the integrator capacitors 60, 62 from the effects of the amplified anomalous voltages at the outputs 30, 32 of the circuit S.

After the disturbance has passed and the detector outputs again return to their normal steady-state values, all four switches 14-20 are again closed and the circuit S is quickly able to return to operation.

Generally, there is a separate magnetic sensor unit 24, 28 for each axis of detection. Each magnetic sensor unit 24, 28 has a corresponding output signal 70, 71, respectively, that is separately electrically conveyed to a corresponding capacitor 44, 46, respectively. Switches 14, 18 are optimally activated concurrently by a signal 74 from the processor module 64. While only two magnetic sensor units 24, 28 are shown in FIG. 1, any desired number of magnetic sensors may be utilized.

Magnetic Sensor Self Test

The second embodiment of the present invention includes a magnetic sensor assembly 100 that uses printed circuit boards (PCB) 102 having a first surface 130 and an opposite, complementary second surface 132 to fabricate the sensor devices 104 and their associated processing circuitry. A trace or conductive element 106, or pair 108a, 108b of complementary printed traces or conductor elements, on or within the board 102 are nut beneath the magnetic sensor element 104, with the return trace or traces routed more remotely from the sensor 104. A single trace 106 could be used to test a single axis sensor element 104, or two orthogonally routed traces 108a, 108b could be used to test a dual axis sensor element 104. An example of a dual axis sensor element 104 is a toroidal fluxgate magnetometer coil. This sensor element example will be used in the associated drawings, though other sensor types could be used with the present invention as well.

A magnetic sensor assembly 100 having a built-in testing capability includes at least one magnetic sensor module 104 for detecting changes in a magnetic field. The magnetic sensor module 104 is preferably mounted on or essentially external to a first surface 130 of a printed circuit board (PCB) member 102 with the first surface 130 of the PCB 102 being positioned between the magnetic sensor module(s) 104 and a second surface 132 of the PCB 102 that is opposite to the first surface 130 of the PCB 102. At least one conductive path or trace 106 is formed between the magnetic sensor module 104 and the second surface 132 of the PCB 102 for conveying an electrical or other electro-magnetic signal 138 beneath the magnetic sensor module 104 to permit operational testing of the magnetic sensor module 104 as desired. Generally, the conductive path or trace 106 is formed within the PCB 102 between the first and second surfaces 130, 132, respectively, but can also be formed on the exterior surfaces of the PCB.

Low DC currents (on the order of a milliampere) are switched through the printed trace(s) 106 or 108a, 108b, causing low-level magnetic field variations in a repeatable spatial relationship to the sensor 104. The resulting magnetic fields are circular or elliptical and perpendicular to the direction of the printed trace(s), and therefore flow in opposite directions on opposite sides of the trace. Because the sensor element 104 is entirely to one side of the trace (i.e., over the trace), the resulting field lines 110, due to current in the trace, pass through the sensitive axis 134, 136 of the sensor element 104 in a single direction 134, 136, such as an X-Y axis orientation. This characteristic, along with the placement precision inherent in printed circuit assembly, allows for the test equipment for the sensor element 104 to be built into the associated sensor circuitry. The test arrangement can be used for either or both manufacturing test and for on-line periodic Built-In-Test (BIT). Standard printed circuit board layout precision provides for a repeatable and inexpensive magnetic field stimulation arrangement.

Figure 2:
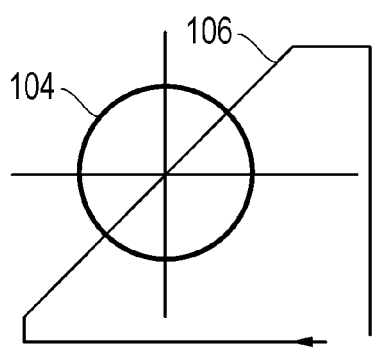
FIG. 2 is a diagram showing current flow associated with a magnetic sensor in a second embodiment of the present invention.
Figure 4:
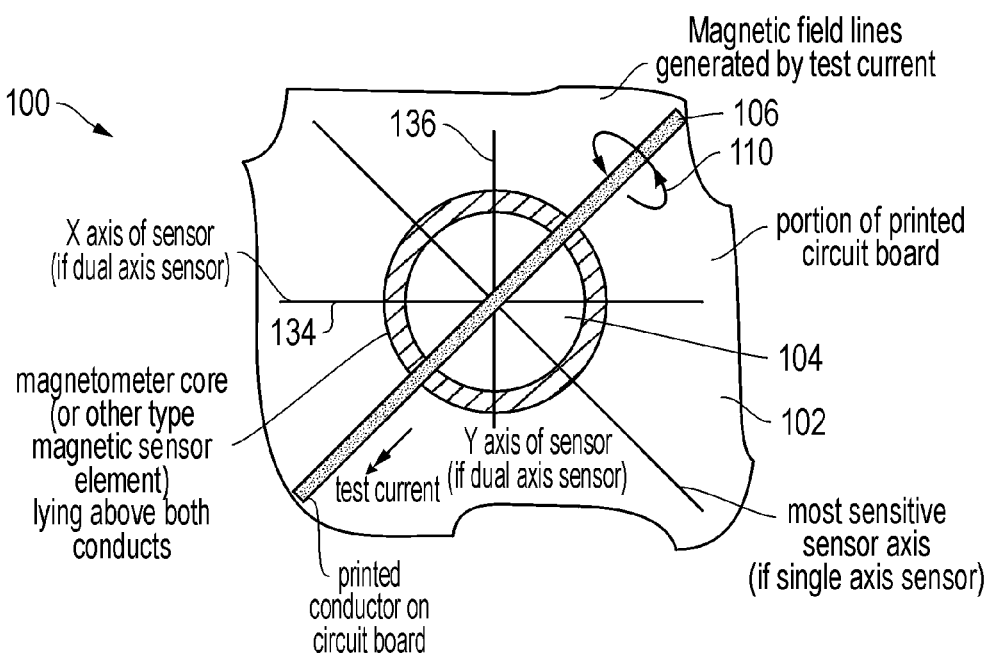
FIG. 4 is a top view of a single primed trace in a printed circuit board used to excite a single or dual axis sensor element with the sensor element drawn as if transparent.
Figure 5:
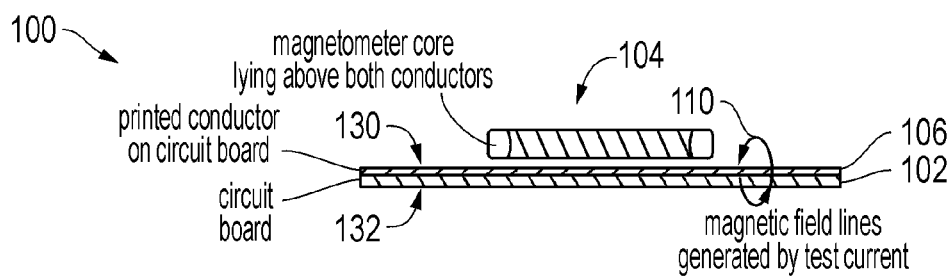
FIG. 5 is cross-sectional side view of FIG. 4.

For a pair of orthogonal sensors 104 for which only sensitivity need be checked, a single trace 106 can be routed at a 45 degree angle from the sensitive axis of the two sensors 104 as is shown in FIGS. 2, 4, and 5. This printed circuit trace or conductor element 106 could then be used to cause repeatable field changes in both sensors 104 simultaneously, under control of local or built-in electronics such as is shown by example in FIG. 9. The same arrangement could also be used with a single axis sensor 104. The changes in the detected field, when the current is turned on and off or is reversed in direction, result in variations in the nearby magnetic field and in the expected sensor output levels, against which the actual outputs of the sensor elements and processing circuitry can be compared.

Figure 3:
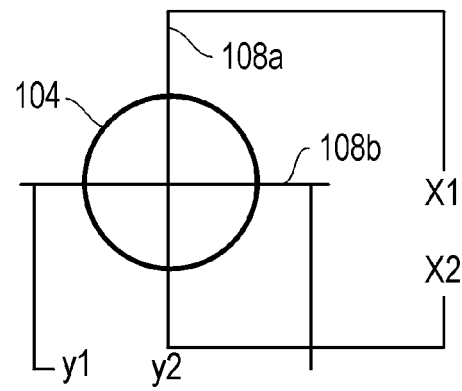
FIG. 3 is another diagram similar to FIG. 2 showing current flow associated with a magnetic sensor in a second embodiment of the present invention.
Figure 6:
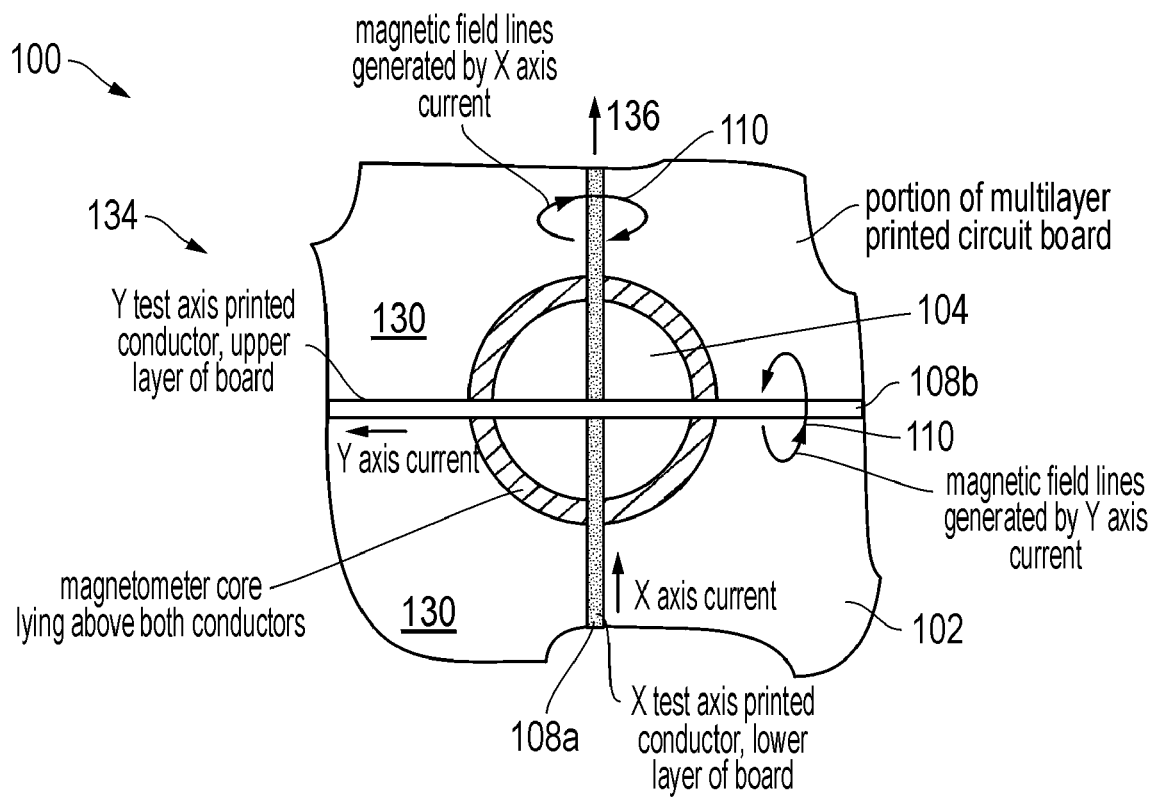
FIG. 6 is a top view of a dual orthogonal printed trace in a printed circuit board used to excite a dual axis sensor element with the sensor element drawn as if transparent.
Figure 7:
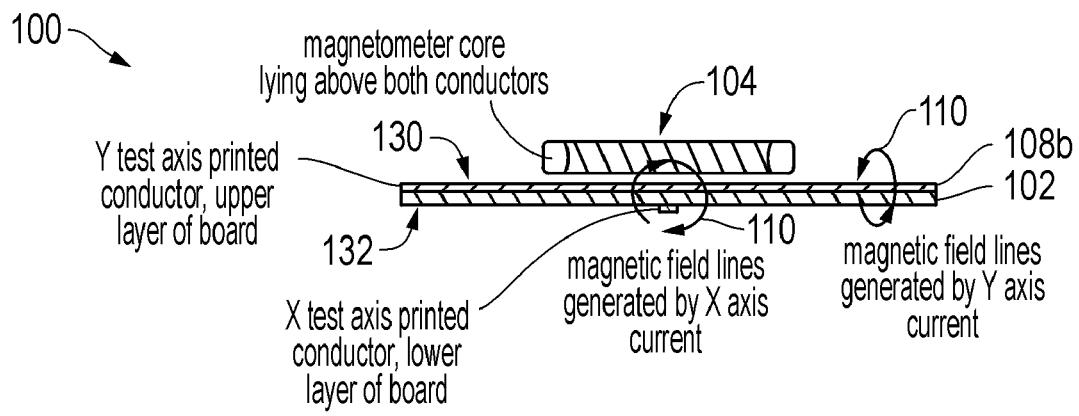
FIG. 7 is cross-sectional side view of FIG. 6.
Figure 8A:
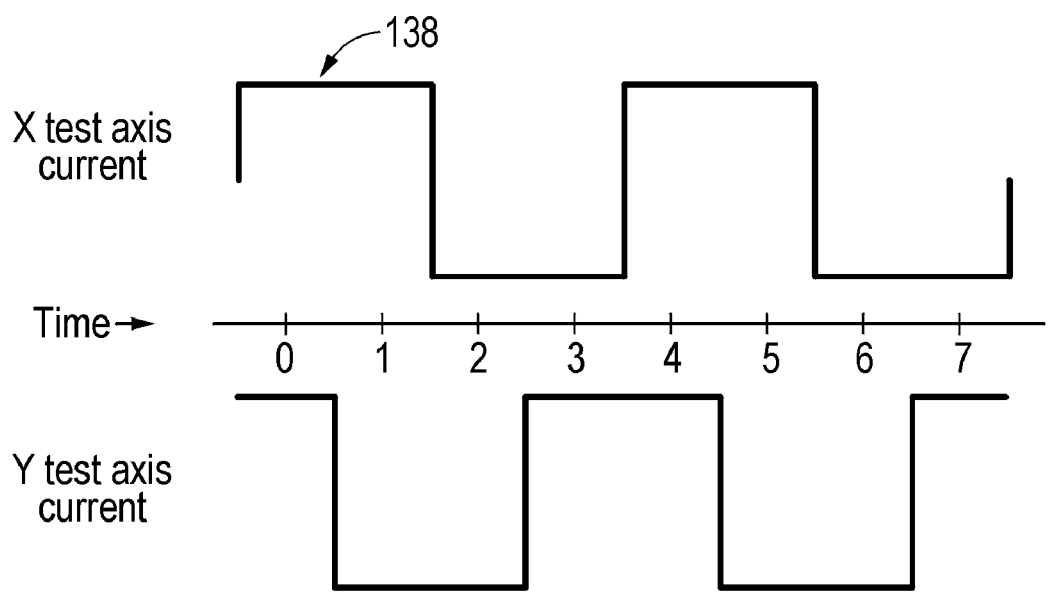
FIG. 8a is a depiction of simultaneous drive signals for orthogonal printed traces.

For more extensive testing of a dual axis sensor 104, for example, a pair of orthogonal traces 108a, 108b can be oriented under the sensor 104 so that each trace 108a, 108b primarily excites a separate sensitive axis as is shown in FIGS. 3, 6 and 7. If each trace 108a, 108b were driven via logic lines (such as from a microprocessor), with current limiting resistors included, the signals on the four lines can be individually toggled high or low in a pattern that can generate sensor output signals such that, when they are viewed on an X-Y plot, will appear as rectangular patterns as is shown in FIG. 8a. The amplitude of these patterns can be used to both verify sensitivity of the sensors 104 in both axes (and in both signal polarities) as well as compared to the level when no stimulation is used to estimate the equivalent background noise level in the sensor. This feature could be called up at any time by the control electronics to verify proper operation of the magnetic sensor(s) 104.

Figure 8B:
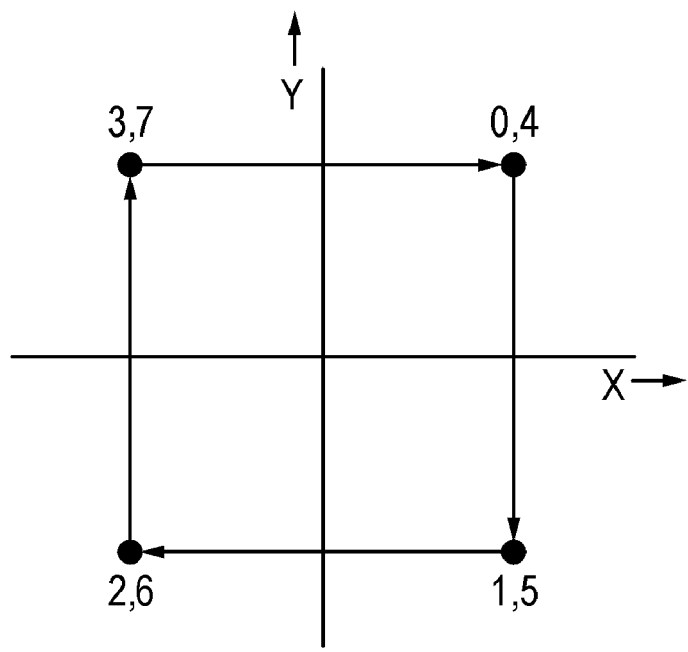
FIG. 8b depicts an expected output of sensors viewed on an X-Y plot basis.

In the arrangement shown in FIGS. 6-7, each trace is driven via logic lines (such as from a microprocessor or logic gates), through current limiting resistors. Each axis could be individually excited and the resulting signals at the individual axis outputs tested in separate operations. Alternately, the two printed traces 108a, 108b could be driven simultaneously by currents in a quadrature pattern (see FIG. 8b).

Figure 9:
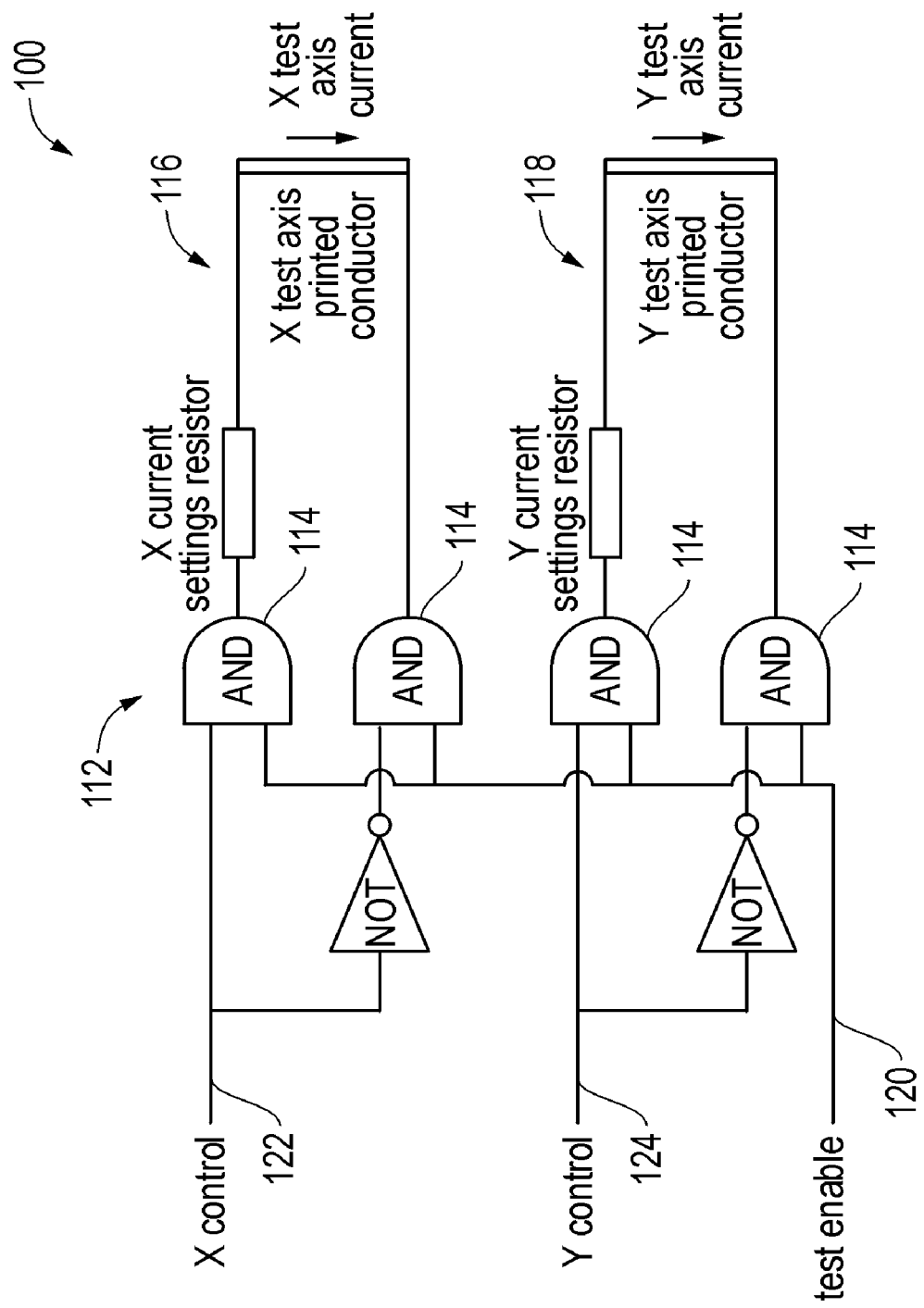
FIG. 9 is an exemplary schematic circuit for dual orthogonal traces.

The signals on the four lines are then individually toggled high or low in a pattern to generate sensor output signals that, when viewed on an X-Y plot, is expected to appear as a rectangular pattern. The amplitude of the pattern (or its height and width) can be used to verify sensitivity of the sensors in both axes (and in both signal polarities). In addition to testing for sensitivity, noise performance can be evaluated by the arrangement. The result can be compared to that of a separate test made with the printed traces un-driven (signal currents equal to 0) to determine equivalent background noise level in the sensor. These tests could be called up at any time by the control electronics to verify proper operation of the magnetic sensor(s). An exemplary drive circuit 112 for the above arrangement is shown in FIG. 9.

The logic gates 114 could be discrete or part of a Field Programmable Gate Array (FPGA) or an operation equivalent to that of the network can be provided by a microprocessor. The "X Control" 122 and "Y Control" 124 lines determine the polarity of the test currents, and can be driven with a waveform similar to that shown in FIG. 8a. When a self test is to be performed, the "test enable" line 120 is set true, and currents are driven through the printed traces in the commanded polarity. When "test enable" is false, no current flows through either conductor and the normal operation of the sensor can thereby be resumed.

Preferably the traces or conductive lines 106, 108a, 108b are below the upper surface of the printed circuit board 102, but may be surface printed or mounted.

The foregoing disclosure and description of the invention are illustrative and explanatory thereof, and various changes in the size, shape and materials, as well as in the details of the illustrated construction may be made without departing from the spirit of the invention.

The invention claimed is:

1. A magnetic sensor assembly having a built-in testing capability comprising:

at least one magnetic sensor module for detecting changes in a magnetic field; the magnetic sensor module being mounted essentially external to a first surface of a printed circuit board (PCB) member with the first surface of the PCB being positioned between the magnetic sensor and a second surface of the PCB that is opposite to the first surface of the PCB;

at least one conductive path formed between the magnetic sensor module and the second surface of the PCB for conveying an electronic signal beneath the magnetic sensor module; and control circuitry means associated with the conductive path for controllably providing the electronic signal to the conductive path to enable testing of the magnetic sensor module.

2. The invention of claim 1 wherein a single conductive path is oriented at approximately a 45 degree angle from a single sensitive axis of the magnetic sensor module.

3. The invention of claim 1 wherein dual conductive paths are oriented at approximately a 90 degree angle from sensitive axes of the magnetic sensor module.

4. The invention of claim 1 wherein the magnetic sensor module is a dual axis sensor.

5. The invention of claim 1 wherein the conductive path is formed within the PCB between the first and second surfaces.

6. The invention of claim 1 wherein a pair or orthogonally oriented conductive paths are formed such that each orthogonal conductive path is able to controllably excite a corresponding sensitive axis of the magnetic sensor module.

7. A method for testing a magnetic sensor assembly of the type including at least one magnetic sensor module for detecting changes in a magnetic field;

the magnetic sensor module being mounted essentially external to a first surface of a printed circuit board (PCB) member with the first surface of the PCB being positioned between the magnetic sensor and a second surface of the PCB that is opposite to the first surface of the PCB, comprising the steps of:

controllably electrically activating at least one conductive path formed between the magnetic sensor module and the second surface of the PCB with an electronic signal beneath the magnetic sensor module for testing the operation of the magnetic sensor; and, controllably deactivating the conductive path formed between the magnetic sensor module and the second surface of the PCB to restore the magnetic sensor module to normal operation.

8. The method of claim 7 wherein a single conductive path is oriented at approximately a 90 degree angle from a sensitive axis of the magnetic sensor module.

9. The method of claim 7 wherein dual conductive paths are oriented at approximately a 45 degree angle from sensitive axes of the magnetic sensor module.

10. The method of claim 7 wherein the magnetic sensor module is a dual axis sensor.

11. The method of claim 7 wherein the conductive path is formed within the PCB between the first and second surfaces.

* * * * *